(12) United States Patent
Leung et al.

(10) Patent No.: US 8,669,572 B2
(45) Date of Patent: Mar. 11, 2014

(54) POWER LAMP PACKAGE

(75) Inventors: Michael Leung, Ventura, CA (US); James Ibbetson, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/149,998

(22) Filed: Jun. 10, 2005

(65) Prior Publication Data
US 2006/0278882 A1    Dec. 14, 2006

(51) Int. Cl.
*H01L 33/60*          (2010.01)

(52) U.S. Cl.
USPC ............... 257/98; 257/99; 257/E33.058

(58) Field of Classification Search
USPC ............... 257/433, 729, 730, 98; 361/600
See application file for complete search history.

(56) References Cited

U.S. PATENT DOCUMENTS

| | | |
|---|---|---|
| 3,760,237 A | 9/1973 | Jaffe .............................. 257/98 |
| 4,307,297 A | 12/1981 | Groff |
| 4,322,735 A | 3/1982 | Sadamasa et al. |
| 4,511,425 A | 4/1985 | Boyd ............................ 156/493 |
| 5,040,868 A | 8/1991 | Waitl |
| 5,122,943 A | 6/1992 | Pugh ............................ 362/256 |
| 5,167,556 A | 12/1992 | Stein |
| 5,351,106 A | 9/1994 | Lesko ............................. 355/83 |
| 5,703,401 A | 12/1997 | Van de Water |
| 5,706,177 A | 1/1998 | Nather |
| 5,790,298 A * | 8/1998 | Tonar ............................ 359/267 |
| 5,813,753 A | 9/1998 | Vriens et al. ................... 362/293 |
| 5,907,151 A | 5/1999 | Gramann |
| 5,942,770 A | 8/1999 | Ishinaga et al. ................. 257/89 |
| 5,959,316 A | 9/1999 | Lowery ........................... 257/98 |
| 6,061,160 A | 5/2000 | Maruyama ..................... 359/152 |
| 6,066,861 A | 5/2000 | Hohn et al. |
| 6,183,100 B1 * | 2/2001 | Suckow et al. ................. 362/35 |
| 6,224,216 B1 | 5/2001 | Parker et al. ..................... 353/31 |
| 6,259,608 B1 | 7/2001 | Berardinelli et al. |
| 6,274,924 B1 | 8/2001 | Carey et al. ..................... 257/676 |
| 6,296,367 B1 | 10/2001 | Parsons et al. ................. 362/183 |

(Continued)

FOREIGN PATENT DOCUMENTS

| | | |
|---|---|---|
| CN | 1274906 A | 11/2000 |
| CN | 2498694 | 7/2002 |

(Continued)

OTHER PUBLICATIONS

JP 2001 060072A, Abstract, Matsushita Electric Ind Co Ltd., Mar. 6, 2001.

(Continued)

*Primary Examiner* — Wael Fahmy
*Assistant Examiner* — Sarah Salerno
(74) *Attorney, Agent, or Firm* — Koppel, Patrick, Heybl & Philpott

(57) ABSTRACT

Adhesive-free assembly of the substrate and reflector components of a semiconductor die package is achieved by injection molding the reflector onto a surface of the substrate or by molding the reflector separate from the substrate and securing it in place on the substrate through deformation of a portion of the reflector. The reflector may be made reflective either by molding the reflector using a light scattering material or through the addition of a reflective element, such as a piece of foil material that is secured to the reflector. A variety of interchangeable reflective elements having different surface shapes, and thus different light reflecting properties, may be made.

29 Claims, 5 Drawing Sheets

(56) References Cited

U.S. PATENT DOCUMENTS

| | | |
|---|---|---|
| 6,359,236 B1 | 3/2002 | DiStefano et al. |
| 6,376,902 B1 | 4/2002 | Arndt ............................ 257/678 |
| 6,447,124 B1 | 9/2002 | Fletcher et al. ................ 359/604 |
| 6,454,437 B1* | 9/2002 | Kelly ............................ 362/246 |
| 6,469,321 B2 | 10/2002 | Arndt |
| 6,480,389 B1 | 11/2002 | Shie et al. ...................... 361/707 |
| 6,517,218 B2 | 2/2003 | Hochstein ....................... 362/294 |
| 6,536,913 B1 | 3/2003 | Yajima et al. .................. 362/231 |
| 6,573,580 B2 | 6/2003 | Arndt |
| 6,610,563 B1 | 8/2003 | Waitl |
| 6,614,058 B2 | 9/2003 | Lin et al. |
| 6,624,491 B2 | 9/2003 | Waitl et al. |
| 6,680,490 B2 | 1/2004 | Yasukawa et al. |
| 6,686,580 B1* | 2/2004 | Glenn et al. ................. 250/208.1 |
| 6,686,609 B1 | 2/2004 | Sung |
| 6,700,136 B2 | 3/2004 | Guida ............................ 257/79 |
| 6,707,069 B2* | 3/2004 | Song et al. ...................... 257/79 |
| 6,710,373 B2 | 3/2004 | Wang |
| 6,759,733 B2 | 7/2004 | Arndt |
| 6,765,235 B2 | 7/2004 | Taninaka et al. ................. 257/88 |
| 6,770,498 B2 | 8/2004 | Hsu ................................ 438/26 |
| 6,774,401 B2 | 8/2004 | Nakada et al. |
| 6,791,259 B1 | 9/2004 | Stokes |
| 6,809,342 B2* | 10/2004 | Harada ............................ 257/79 |
| 6,858,879 B2 | 2/2005 | Waitl |
| 6,872,585 B2 | 3/2005 | Matsumura et al. |
| 6,876,149 B2 | 4/2005 | Miyashita |
| 6,900,511 B2 | 5/2005 | Ruhnau et al. |
| 6,911,678 B2 | 6/2005 | Fujisawa et al. |
| 6,914,268 B2 | 7/2005 | Shei et al. ....................... 257/99 |
| 6,919,586 B2 | 7/2005 | Fujii |
| 6,940,704 B2 | 9/2005 | Stalions |
| 6,946,714 B2 | 9/2005 | Waitl |
| 6,964,877 B2 | 11/2005 | Chen et al. ...................... 438/20 |
| 6,975,011 B2 | 12/2005 | Arndt |
| 6,995,510 B2 | 2/2006 | Murakami et al. |
| D517,025 S | 3/2006 | Asakawa ..................... D13/180 |
| 7,009,627 B2 | 3/2006 | Abe et al. ....................... 345/690 |
| 7,021,797 B2 | 4/2006 | Minano et al. ................. 362/355 |
| 7,064,907 B2 | 6/2006 | Kaneko |
| 7,066,626 B2 | 6/2006 | Omata |
| 7,102,213 B2 | 9/2006 | Sorg |
| 7,119,422 B2 | 10/2006 | Chin ................................ 257/666 |
| 7,161,189 B2 | 1/2007 | Wu ................................ 257/98 |
| 7,210,807 B2* | 5/2007 | Sakamoto et al. ............... 362/84 |
| 7,224,000 B2 | 5/2007 | Aanegola et al. ............... 257/98 |
| 7,244,965 B2 | 7/2007 | Andrews et al. |
| 7,282,740 B2 | 10/2007 | Chikugawa et al. ............ 257/79 |
| 7,285,802 B2* | 10/2007 | Ouderkirk et al. ............. 257/98 |
| D572,210 S | 7/2008 | Lee ............................ D13/180 |
| D572,670 S | 7/2008 | Ono et al. ..................... D13/180 |
| D576,574 S | 9/2008 | Kobayakawa ............... D13/180 |
| 7,579,628 B2 | 8/2009 | Inoguchi ......................... 257/81 |
| 7,635,915 B2 | 12/2009 | Xie et al. ....................... 257/692 |
| 7,777,412 B2 | 8/2010 | Pang ............................ 313/506 |
| 7,875,899 B2 | 1/2011 | Yasuda ........................... 257/99 |
| 2002/0021085 A1* | 2/2002 | Ng ................................ 313/499 |
| 2002/0030194 A1 | 3/2002 | Camras et al. |
| 2002/0061174 A1 | 5/2002 | Hurt et al. |
| 2002/0066905 A1 | 6/2002 | Wang |
| 2002/0123163 A1 | 9/2002 | Fujii |
| 2002/0163001 A1 | 11/2002 | Shaddock |
| 2002/0171911 A1* | 11/2002 | Maegawa ..................... 359/308 |
| 2002/0195935 A1 | 12/2002 | Jager |
| 2003/0116769 A1 | 6/2003 | Song et al. |
| 2003/0183852 A1* | 10/2003 | Takenaka ...................... 257/200 |
| 2004/0041222 A1* | 3/2004 | Loh ................................ 257/433 |
| 2004/0079957 A1 | 4/2004 | Andrews et al. |
| 2004/0080939 A1 | 4/2004 | Braddell et al. |
| 2004/0126913 A1 | 7/2004 | Loh |
| 2004/0217364 A1 | 11/2004 | Tarsa |
| 2004/0227149 A1 | 11/2004 | Ibbetson |
| 2004/0232435 A1 | 11/2004 | Hofer |
| 2004/0238930 A1 | 12/2004 | Arndt |
| 2004/0256706 A1 | 12/2004 | Nakashima |
| 2005/0023548 A1 | 2/2005 | Bhat |
| 2005/0072981 A1 | 4/2005 | Suenaga |
| 2005/0077535 A1 | 4/2005 | Li |
| 2005/0093005 A1 | 5/2005 | Ruhnau |
| 2005/0117325 A1 | 6/2005 | Hsieh |
| 2005/0127377 A1 | 6/2005 | Arndt |
| 2005/0135105 A1 | 6/2005 | Teixeira et al. |
| 2005/0152127 A1 | 7/2005 | Kamiya et al. |
| 2005/0156187 A1 | 7/2005 | Isokawa |
| 2005/0179041 A1 | 8/2005 | Harbers et al. |
| 2005/0179376 A1* | 8/2005 | Fung et al. ..................... 313/512 |
| 2005/0221518 A1* | 10/2005 | Andrews et al. ............... 438/27 |
| 2005/0231983 A1 | 10/2005 | Dahm |
| 2006/0022212 A1 | 2/2006 | Waitl |
| 2006/0049477 A1 | 3/2006 | Arndt |
| 2006/0091406 A1 | 5/2006 | Kaneko et al. .................. 257/81 |
| 2006/0102917 A1 | 5/2006 | Oyama et al. |
| 2006/0108594 A1 | 5/2006 | Iwasaki et al. |
| 2006/0133044 A1 | 6/2006 | Kim et al. |
| 2006/0151809 A1 | 7/2006 | Isokawa |
| 2006/0157828 A1 | 7/2006 | Sorg |
| 2006/0220046 A1 | 10/2006 | Yu et al. |
| 2006/0291185 A1 | 12/2006 | Atsushi ............................ 362/29 |
| 2007/0046176 A1 | 3/2007 | Bukesov et al. |
| 2007/0096139 A1 | 5/2007 | Schultz |
| 2007/0109779 A1 | 5/2007 | Sekiguchi et al. |
| 2007/0145401 A1 | 6/2007 | Ikehara |
| 2007/0170449 A1 | 7/2007 | Anandan |
| 2007/0241357 A1 | 10/2007 | Yan ................................ 257/98 |
| 2007/0269586 A1 | 11/2007 | Leatherdale |
| 2007/0295975 A1 | 12/2007 | Omae ............................ 257/89 |
| 2008/0013319 A1 | 1/2008 | Pei et al. |
| 2008/0074032 A1 | 3/2008 | Yano et al. |
| 2008/0093606 A1 | 4/2008 | Pan et al. |
| 2008/0121921 A1 | 5/2008 | Loh et al. |
| 2008/0149960 A1 | 6/2008 | Amo et al. ...................... 257/98 |
| 2008/0170391 A1 | 7/2008 | Norfidathul et al. .......... 362/227 |
| 2008/0186702 A1 | 8/2008 | Camras et al. |
| 2008/0191232 A1 | 8/2008 | Lee et al. |
| 2008/0198594 A1 | 8/2008 | Lee |
| 2008/0296590 A1 | 12/2008 | Ng ................................ 257/88 |
| 2008/0303052 A1 | 12/2008 | Lee et al. |
| 2008/0308825 A1 | 12/2008 | Chakraborty |
| 2009/0050908 A1 | 2/2009 | Yuan et al. |
| 2009/0050911 A1 | 2/2009 | Chakraborty |
| 2009/0057699 A1 | 3/2009 | Basin |
| 2009/0072251 A1 | 3/2009 | Chan et al. |
| 2009/0129085 A1 | 5/2009 | Aizar et al. ..................... 362/247 |
| 2009/0189178 A1 | 7/2009 | Kim et al. |
| 2009/0283781 A1 | 11/2009 | Chan et al. |
| 2010/0044735 A1 | 2/2010 | Oyamada |
| 2011/0049545 A1 | 3/2011 | Basin et al. ..................... 257/98 |
| 2011/0108874 A1 | 5/2011 | Chu et al. |
| 2011/0121345 A1 | 5/2011 | Andrews et al. |
| 2011/0193118 A1 | 8/2011 | Oshima et al. |
| 2011/0278617 A1 | 11/2011 | Lee |
| 2012/0235199 A1 | 9/2012 | Andrews et al. |

FOREIGN PATENT DOCUMENTS

| | | |
|---|---|---|
| CN | 2617039 | 5/2004 |
| CN | 2646873 | 10/2004 |
| CN | 1581527 A | 2/2005 |
| CN | 1591924 A | 3/2005 |
| CN | 1679168 A | 10/2005 |
| CN | 1744335 A | 3/2006 |
| CN | 1801498 A | 7/2006 |
| CN | 1720608 A | 11/2006 |
| CN | 1874011 A | 12/2006 |
| CN | 1913135 A | 2/2007 |
| CN | 1977399 A | 6/2007 |
| CN | 101005109 A | 7/2007 |
| CN | 101061590 A | 10/2007 |
| CN | 101360368 | 2/2009 |
| EP | 1005085 A2 | 5/2000 |
| EP | 1187226 A1 | 3/2002 |
| EP | 1187227 | 3/2002 |
| EP | 1187228 | 3/2002 |
| EP | 1 418 630 A1 | 5/2004 |

(56) References Cited

FOREIGN PATENT DOCUMENTS

| | | |
|---|---|---|
| EP | 1521313 | 4/2005 |
| EP | 1 538 680 A2 | 6/2005 |
| EP | 1864780 | 12/2007 |
| EP | 1 953 834 A1 | 8/2008 |
| GB | 2420221 A | 11/2004 |
| GB | 2420221 A | 5/2006 |
| GB | 2 458 972 A | 10/2009 |
| GB | 2466633 A | 7/2010 |
| JP | 53-118019 | 10/1978 |
| JP | S53126570 | 10/1978 |
| JP | S531218019 | 10/1978 |
| JP | 59-027559 A | 2/1984 |
| JP | 59027559 | 2/1984 |
| JP | 61-048951 A | 3/1986 |
| JP | 61048951 | 3/1986 |
| JP | 03-171780 | 7/1991 |
| JP | 06-177424 | 6/1994 |
| JP | 7-202271 A | 8/1995 |
| JP | 07202271 | 8/1995 |
| JP | 08032120 | 2/1996 |
| JP | 8139257 | 5/1996 |
| JP | 10321909 | 12/1998 |
| JP | 11008405 | 1/1999 |
| JP | 11-054802 | 2/1999 |
| JP | 11-167805 A | 6/1999 |
| JP | 11150306 | 6/1999 |
| JP | 11261113 | 9/1999 |
| JP | 2000-188358 | 7/2000 |
| JP | 2000-223751 | 8/2000 |
| JP | 2000223752 | 8/2000 |
| JP | 2000261041 | 9/2000 |
| JP | 2001044506 | 2/2001 |
| JP | 2001-168400 | 6/2001 |
| JP | 2001060072 * | 6/2001 ............. H01L 33/00 |
| JP | 2001237463 | 8/2001 |
| JP | 2001518692 | 10/2001 |
| JP | 2002-223005 | 8/2002 |
| JP | 2003-197974 | 7/2003 |
| JP | 2003-264267 | 9/2003 |
| JP | 2004046075 | 2/2004 |
| JP | 2004103775 | 2/2004 |
| JP | 2004507114 | 3/2004 |
| JP | 2004-111937 A | 4/2004 |
| JP | 2004146815 | 5/2004 |
| JP | 2004-200236 | 7/2004 |
| JP | 2004335740 | 11/2004 |
| JP | 2004335880 | 11/2004 |
| JP | 2005-019838 A | 1/2005 |
| JP | 2005019838 | 1/2005 |
| JP | 2005-079167 | 3/2005 |
| JP | 2005150624 | 6/2005 |
| JP | 2005-310935 | 11/2005 |
| JP | 2005347401 | 12/2005 |
| JP | 2006019557 | 1/2006 |
| JP | 2006509372 A | 3/2006 |
| JP | S62160564 | 3/2006 |
| JP | 2006-119357 | 5/2006 |
| JP | 2006-324331 | 11/2006 |
| JP | 2007-094088 | 4/2007 |
| JP | 2007509505 | 4/2007 |
| JP | 2007-165029 | 6/2007 |
| JP | 2007184542 | 7/2007 |
| JP | 2007-273763 | 10/2007 |
| JP | 2007-287981 | 11/2007 |
| JP | 2007-299905 | 11/2007 |
| JP | 2007329516 | 12/2007 |
| JP | 2008521236 | 6/2008 |
| WO | WO 9931737 | 6/1999 |
| WO | WO 0217405 | 2/2002 |
| WO | WO 03049204 | 6/2003 |
| WO | WO 2004027882 | 4/2004 |
| WO | WO 2004044877 | 5/2004 |
| WO | WO 2004044877 A2 * | 5/2004 |
| WO | WO 2004/053933 A2 | 6/2004 |
| WO | WO 2005043627 A1 | 5/2005 |
| WO | WO 2005104247 | 11/2005 |
| WO | WO 2006016398 | 2/2006 |
| WO | WO2006/054228 A2 | 5/2006 |
| WO | WO 2006054228 | 5/2006 |
| WO | WO 2006054228 A2 | 5/2006 |
| WO | WO 2006054228 A3 | 5/2006 |
| WO | WO 2006054228 | 6/2006 |
| WO | WO 2007/083408 A1 | 7/2007 |
| WO | WO2007/127029 A2 | 11/2007 |
| WO | WO 2007122516 | 11/2007 |
| WO | WO 2008082098 | 7/2008 |
| WO | WO 2009/074919 A1 | 6/2009 |
| WO | WO 2010005294 | 1/2010 |

OTHER PUBLICATIONS

Publication No. US 2004/0047151 A1, Publication Date, Mar. 11, 2004, Bogner et al.
International Publication No. WO 2005/043627, Publication Date May 12, 2005, Cree, Inc.
Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-002857, dated: Apr. 24, 2009, pp. 1-2.
Official Notice of Decision for Refusal regarding related Japanese Design Application No. 2009-002857, dated Nov. 17, 2009.
Preliminary Notice of Reasons for Refusal re related Japanese Application No. 2009-002857, dated: Jul. 24, 2009.
Office Action from related China Application No. 200710142310.7, dated: Dec. 11, 2009.
Declaration of Gerald Negley under 37 C.F.R.§ 1.132, dated: Aug. 20, 2009.
Declaration of Charles Swoboda under 37 C.F.R.§ 1.132, dated: Aug. 19, 2009.
Office Action from U.S. Appl. No. 12/154,691, dated: Dec. 17, 2009.
Response to Office Action from U.S. Appl. No. 12/154,691. dated: May 17, 2010.
Office Action from U.S. Appl. No. 11/465,120, dated: Mar. 9, 2010.
Office Action from U.S. Appl. No. 12/152,766. dated: Mar. 12, 2010.
Office Action from U.S. Appl. No. 12/069,827, dated: Apr. 20, 2010.
Office Action from U.S. Appl. No. 12/321,059. dated: May 17, 2010.
Office Action from U.S. Appl. No. 11/149,998, dated: May 18, 2010.
First Office Action for Chinese Patent Application No. 200780019643.9 dated Mar. 29, 2010.
International Search Report for PCT/CN2009/074800 mailed Feb. 25, 2010.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 12/695,978, dated: Dec. 20, 2010.
Office Action in related U.S. Appl. No. 12/695,978, dated: May 10, 2010.
Office Action in related U.S. Appl. No. 11/496,922, dated: Jun. 10, 2010.
Office Action in related U.S. Appl. No. 11/496,922, dated: Dec. 15, 2010.

(56) References Cited

OTHER PUBLICATIONS

Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/069,827, dated: Oct. 29, 2010.
Office Action in related U.S. Appl. No. 12/069,827, dated: Apr. 20, 2010.
Office Action in related U.S. Appl. No. 12/069,827, dated: Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
Cree® XLAMP® MC-E LEDS Product Info Sheets, pp. 1-3.
Nichia Corporation LEDS, Models NSSM016G, NSSM227, NESM026X, NSSM026BB, NESM005A, 9 Pages.
Appeal Decision in Japanese Design Patent Application No. 2009-002857 (Appeal No. 2010-002154) mailed Aug. 20, 2010.
Notification of First Office Action in Chinese Patent Application No. 200880009255.7 mailed Sep. 26, 2010.
International Search Report and Written Opinion from PCT/CN2010/001009 mailed Oct. 21, 2010.
International Search Report and Written Opinion from PCT/US2010/001852 mailed Nov. 11, 2010.
Office Action from U.S. Appl. No. 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No. 12/069,827, dated: Jun. 16, 2011.
Response to Office Action from U.S. Appl. No. 12/069,827, OA dated: Jul. 16, 2011, Resp. dated: Aug. 3, 2011.
Office Action from U.S. Appl. No. 12/321,059, dated: Jun. 22, 2011.
Response to Office Action from U.S. Appl. No. 12/321,059, OA dated: Jun. 22, 2011, Resp. dated: Aug. 22, 2011.
Office Action from U.S. Appl. No. 12/321,059, dated: Aug. 26, 2011.
Response to Office Action from U.S. Appl. No. 12/321,059, OA dated: Jun. 22, 2011, Resp. dated: Sep. 20, 2011.
Office Action from U.S. Appl. No. 11/496,922, dated: Jul. 5, 2011.
Office Action from U.S. Appl. No. 12/695,978, dated: Sep. 14, 2011.
Office Action from U.S. Appl. No. 12/321,059, dated: Oct. 4, 2011.
Office Action from U.S. Appl. No. 12/069,827, dated: Oct. 26, 2011.
Extended Search Report for European Patent Application No. 09824413.0-1551, dated Feb. 11, 2013.
Second Office Action from Chinese Patent Appl. No. 201110039138.9, dated Jan. 31, 2013.
International Search Report and Written Opinion from PCT application No. PCT/US2012/065060, dated Feb. 20, 2013.
Notification of the First Office Action from Chinese Patent Application No. 201010167346.2, dated Feb. 29, 2012.
Office Action from U.S. Appl. No. 11/465,120, mailed Dec. 9, 2011.
Office Action from U.S. Appl. No. 12/002,410, mailed Mar. 28, 2012.
Office Action from U.S. Appl. No. 12/002,410, mailed Dec. 21, 2011.
Response to Office Action for U.S. Appl. No. 12/002,410, filed Mar. 8, 2012.
Office Action from U.S. Appl. No. 12/757,179, mailed Jan. 19, 2012.
Office Action from U.S. Appl. No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. No. 11/982,273, mailed Mar. 23, 2012.
Office Action from U.S. Appl. No. 12/614,989, mailed Mar. 12, 2012.
Office Action from U.S. Appl. No. 12/069,827, mailed Apr. 3, 2012.
Notice of Reasons for Rejection from Japanese Patent Application No. 2009-507195, dated May 8, 2012.
First Office Action for Chinese Patent Application No. 200980153995.2 , dated May 4, 2012.
First Office Action for Chinese Patent Application No. 200910145412.3. dated Apr. 28, 2012.
Office Action from U.S. Appl. No. 11/465,120. dated: Jun. 19, 2012.
Office Action from U.S. Appl. No. 11/982,275. dated: Jul. 9, 2012.
Office Action from U.S. Appl. No. 12/757,179. dated: Jul. 16, 2012.
First Office Action for Chinese Patent Application No. 201110039138.9, dated Jun. 4, 2012.
Decision of Rejection from Japanese Patent Application No. 2008-515699, dated Jul. 17, 2012.
Notice of Reasons for Rejection for Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
Notice of Reasons for Rejection for counterpart Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
First Office Action for Chinese Patent Application No. CN 200710152109.7 issued Jul. 29, 2011.
Extended Supplementary European Search Report for application No. EP 07789665.2 dated Nov. 7, 2011.
Decision of Rejection for Japanese Patent Application No. 2007-211901, dated: Jan. 30, 2012.
First Office Action from Chinese Patent Application No. 201080001658.4, dated Sep. 24, 2012.
Interrogation from Japanese Patent Application No. 2007-211901, dated Aug. 21, 2012.
Examination Report from European Patent Application No. 07789665.2, dated Aug. 21, 2012.
Decision of Rejection from Chinese Patent Application No. 200880009255.7, dated Sep. 5, 2012.
Second Office Action for Chinese Patent Application No. CN200880009255.7 mailed Oct. 13, 2011.
International Search Report and Written Opinion for PCT Application No. PCT/US2011/001457 mailed Dec. 13, 2011.
Office Action from U.S. Appl. No. 11/465,120, dated: Dec. 9, 2011.
Third Office Action from Chinese Patent Application No. 200710152109.7. dated: Mar. 5, 2013.
Notice of Reasons for Rejection from Japanese Patent Application No. 2007-211901, dated Apr. 9, 2013.
Decision of Rejection from Japanese Patent Application No. 2011-545616, dated Apr. 26. 2013.
Decision of Rejection from Japanese Patent Application No 2009-507195, dated May 21. 2013.
Notice of Reasons for Rejection from Japanese Patent Appl. No. 2011-259253, dated May 28, 2013.
Decision of Rejection from Japanese Patent Appl. No. 2008-281533, dated May 28, 2013.
Interrogation from Japanese Patent Application No. 2008-515699, dated Feb. 19, 2013.
Communication from European Patent Appl. No. 09824413.0/1551, dated Feb. 28, 2013.

(56) References Cited

OTHER PUBLICATIONS

European Search Report from European Patent Appl. No 098244130-1551. dated Feb. 11, 2013.
Notice of Reasons for Rejection from Japanese Patent Appl. No. 2011-534993, dated Mar. 12, 2013.
Notification of the Second Office Action from Chinese Patent Application No. 201010167346.2. dated Feb. 17, 2013.
Appeal Decision from Japanese Patent Appl. No. 2008-515699, dated Sep. 20. 2013.
Office Action from Japanese Patent Appl. No. 2012-288000, dated Oct. 8, 2013.
Office Action from U.S. Appl. No. 11/982,275, dated Aug. 8, 2013.
Office Action from U.S. Appl. No. 12/291.293, dated Aug. 20, 2013.
Decision of Rejection from Chinese Patent Appl. No. 201001067346.2, dated Aug. 30, 2013.
Office Action from U.S. Appl. No. 12/695,978, dated Sep. 17, 2013.
Office Action from U.S. Appl. No. 13/652.241, dated Sep. 11, 2013.
Office Action from U.S. Appl. No. 12/002,410, dated Sep. 10, 2013.

* cited by examiner

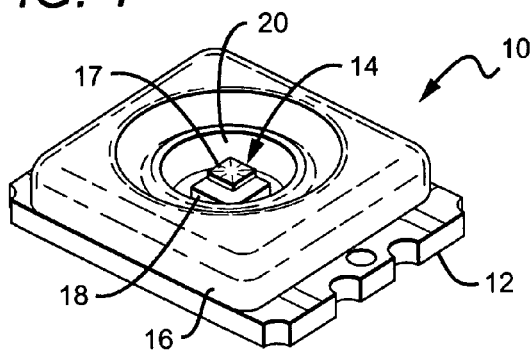
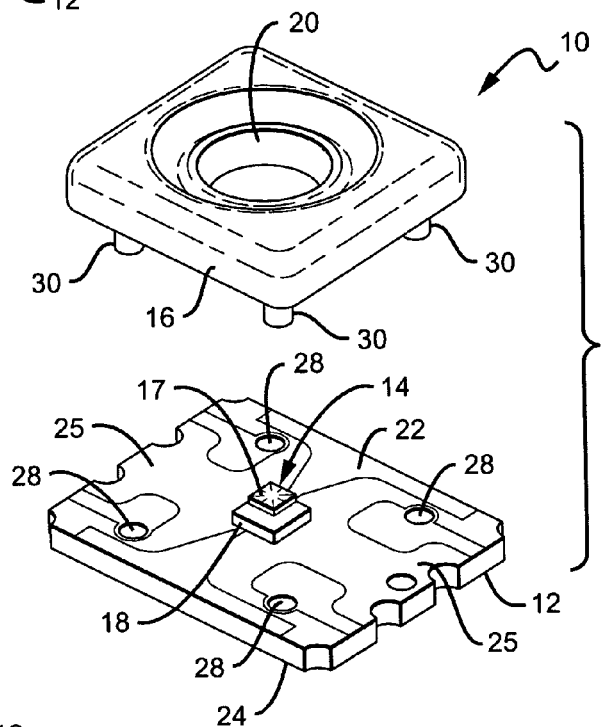
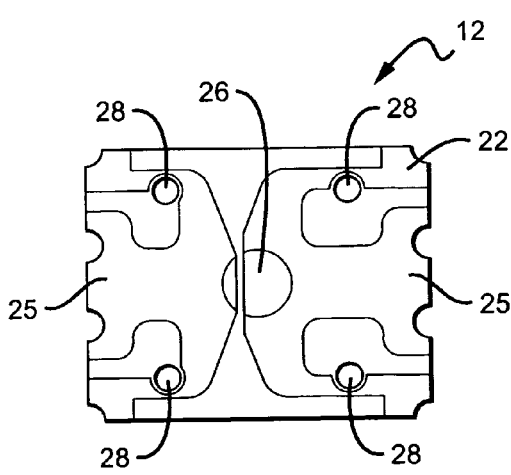
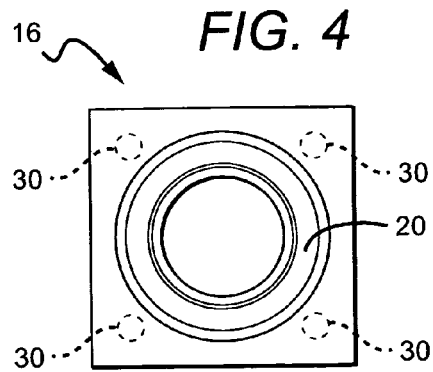

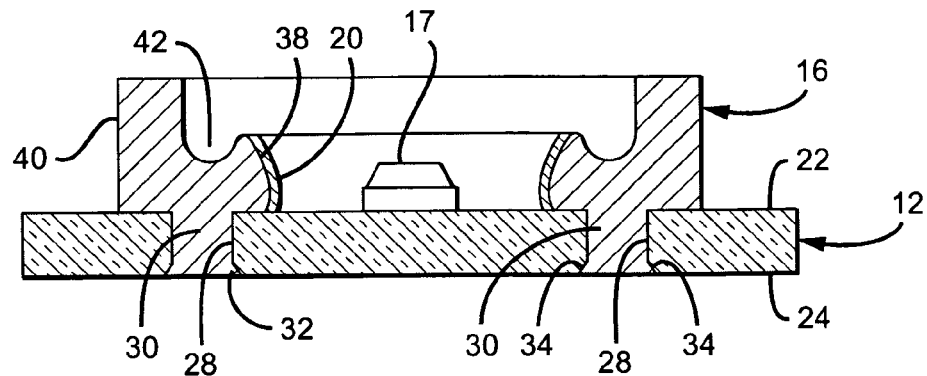
FIG. 5
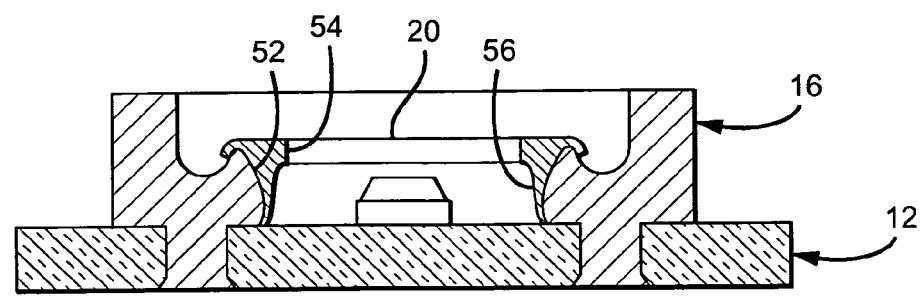
FIG. 6
FIG. 7

*FIG. 8*
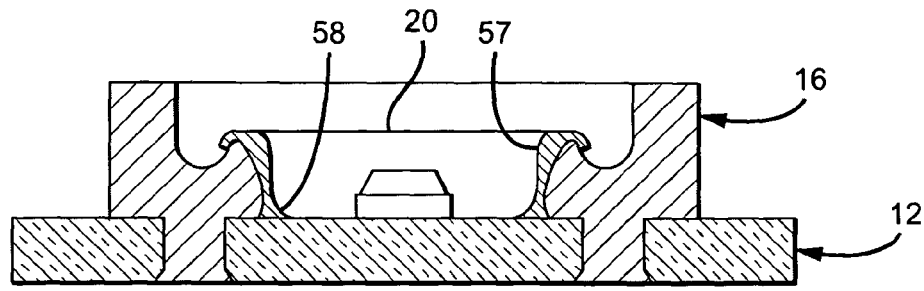
*FIG. 9*
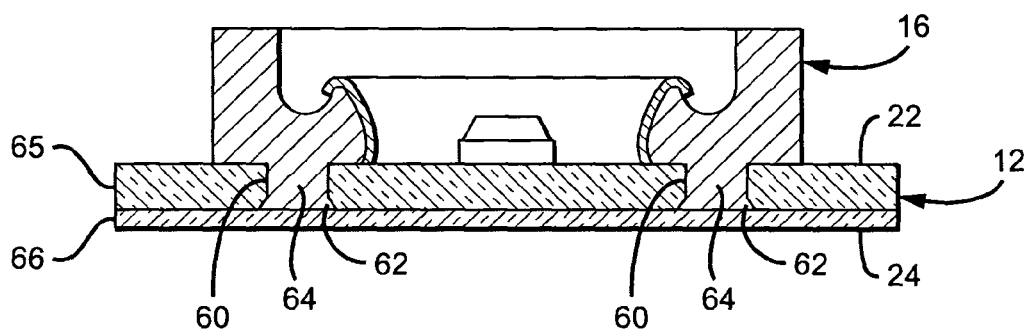
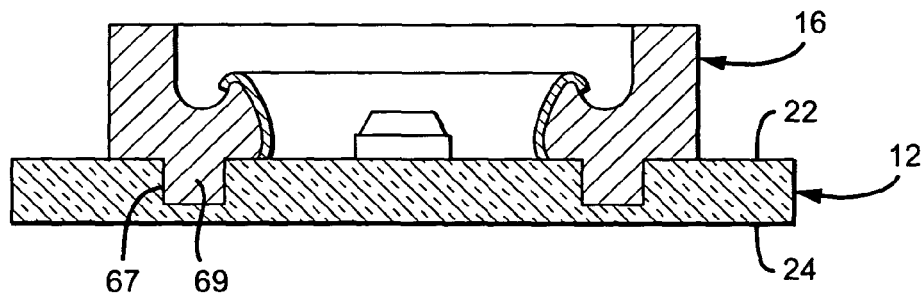
*FIG. 10*

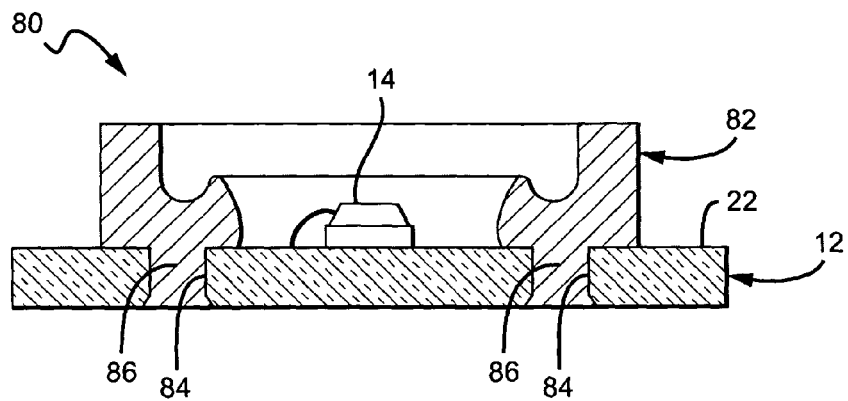
FIG. 15
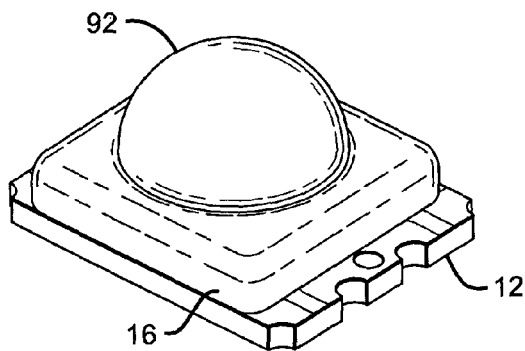
FIG. 16
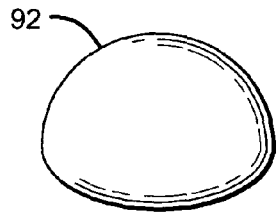
FIG. 17
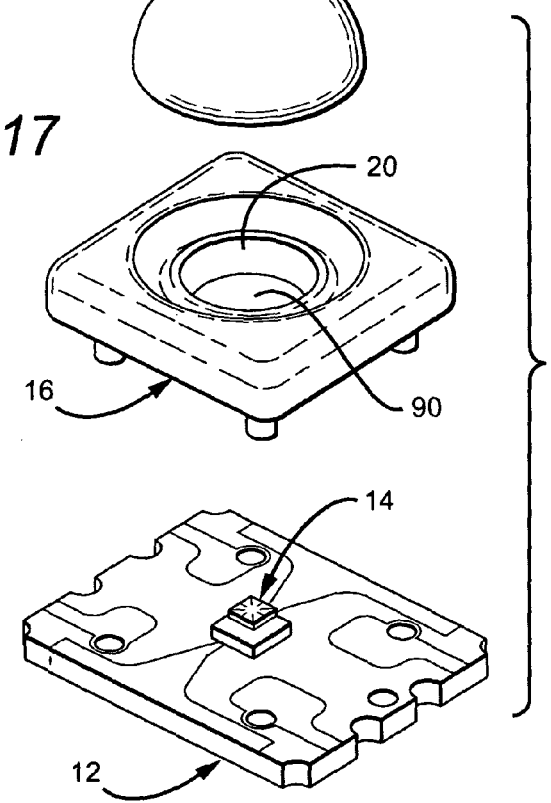

POWER LAMP PACKAGE

BACKGROUND OF THE INVENTION

1. Field of the Invention

This invention relates to semiconductor device die packages, and more particularly to light emitting diode (LED) die packages.

2. Description of Related Art

It is known to provide semiconductor light emitting devices, such as a light emitting diode (LED), in a package that may provide protection, color selection, focusing and the like for light emitted by the light emitting device (LED package). An LED package generally includes a substrate member on which a light emitting device is mounted. The light emitting device may, for example, include an LED chip/submount assembly mounted to the substrate member with electrical connections being made to the LED for applying an electrical bias. It is understood in the art that LEDs generally comprise an active region of semiconductor material sandwiched between two oppositely doped layers. When a bias is applied across the doped layers, holes and electrons are injected into the active region where they recombine to generate light. Light is emitted omnidirectionally from the active layer and from all surfaces of the LED. The substrate member may also include traces or metal leads for connecting the package to external circuitry and the substrate may also act as a heat sink to conduct heat away from the LED during operation.

A reflector, such as the reflector cup, may be mounted on the substrate and surround the LED, with the reflector cup including an angled or sloped lower sidewall for reflecting light generated by the LED upwardly and away from the LED package. The reflector cup may also include upwardly-extending walls that may act as a cavity or opening surrounding the LED. After the LED and reflector cup are mounted on the substrate an encapsulating material, such as liquid silicone gel, can be dispensed into an interior cavity of the reflector cup. The reflective cup cavity has a bottom surface defined by the substrate to provide a closed cavity capable of retaining the liquid encapsulating material. A lens may then be placed over the reflector cup cavity in contact with the encapsulating material and the encapsulating material is typically cured to form the final die package.

The reflective cup can be silver plated in portions, such as on its angled or sloped lower sidewall, to further enhance its reflectivity. One conventional reflector cup comprises silver plated copper. A current LED die package manufacturing process includes a step of mounting the silver plated copper reflector to the substrate by an adhesive. It has been noted that the adhesive used to bond the reflector to the substrate may potentially cause the silver plated copper reflector to tarnish and its reflective properties to become degraded. The bonding step may also introduce variations in the relative height positioning between the reflector and other package components including the LED. This in turn may adversely affect the reflective capabilities of the reflector and the light output of the LED package.

SUMMARY OF THE INVENTION

Briefly, and in general terms, the invention is directed to semiconductor die packages and methods of making such packages. In one aspect, the invention relates to a semiconductor device die package that includes a substrate having a first surface for supporting a semiconductor device, a second surface and at least one thru-hole between the first and second surfaces. The package also includes a base on the first surface that is secured to the substrate at least partially through the at least one thru-hole.

In another aspect, the invention relates to a method of forming a semiconductor die package. A substrate having a first surface for supporting a semiconductor device, a second surface and at least one thru-hole between the first and second surfaces is obtained and a base is formed on the first surface.

In another aspect, the invention relates to a light emitting diode (LED) die package that includes a substrate having first and second surfaces, at least one thru-hole between the first and second surfaces and a mounting pad on the first surface. The package also includes a base on the first surface that is at least partially secured to the substrate through the at least one thru-hole. The base has an inner surface that substantially surrounds the mounting pad. The package further includes a reflective element associated with the inner surface and an LED assembly that is mounted on the mounting pad.

In yet another aspect, the invention relates to a light emitting diode (LED) die package that includes a substrate having first and second surfaces and a mounting pad on the first surface. The package also includes a base that is secured to the first surface. The base has an inner surface that substantially surrounds the mounting pad. The package further includes a reflective element that is associated with the inner surface and an LED assembly that is mounted on the mounting pad.

These and other aspects and advantages of the invention will become apparent from the following detailed description and the accompanying drawings which illustrate by way of example the features of the invention.

BRIEF DESCRIPTION OF THE DRAWINGS

FIG. 1 is a perspective view of one embodiment of a semiconductor die package according to the present invention;

FIG. 2 is an exploded view of the semiconductor die package of FIG. 1;

FIG. 3 is a plan view of the substrate in the semiconductor die package of FIG. 1;

FIG. 4 is a plan view of the reflector cup in the semiconductor die package of FIG. 1;

FIG. 5 is a sectional view of one embodiment of a semiconductor die package according to the present invention wherein the reflector cup includes a press-fit reflective element;

FIG. 6 is a sectional view of another embodiment of a semiconductor die package according to the present invention wherein the reflector assembly includes a snap-fit reflective element;

FIG. 7 is a sectional view of another embodiment of a semiconductor die package according to the present invention wherein the reflector assembly includes a snap-fit reflective element having a different shape than the reflective element of FIG. 6;

FIG. 8 is a sectional view of another embodiment of a semiconductor die package according to the present invention wherein the reflector assembly includes a snap-fitted reflective element having still a different shape;

FIG. 9 is a sectional view of another embodiment of a semiconductor die package according to the present invention wherein reflector cup's posts pass through part of the substrate;

FIG. 10 is a sectional view of another embodiment of a semiconductor die package according to the present invention wherein the reflector cup's posts pass through part of the substrate;

FIG. 15 is a sectional view of another embodiment of a semiconductor die package according to the present invention wherein the reflector assembly is formed of a light reflective material;

FIG. 16 is a perspective view of one embodiment of a die package according to the present invention having a lens; and FIG. 17 is a exploded perspective view of the die package in FIG. 16.

DETAILED DESCRIPTION OF THE PREFERRED EMBODIMENTS

Figure 11:
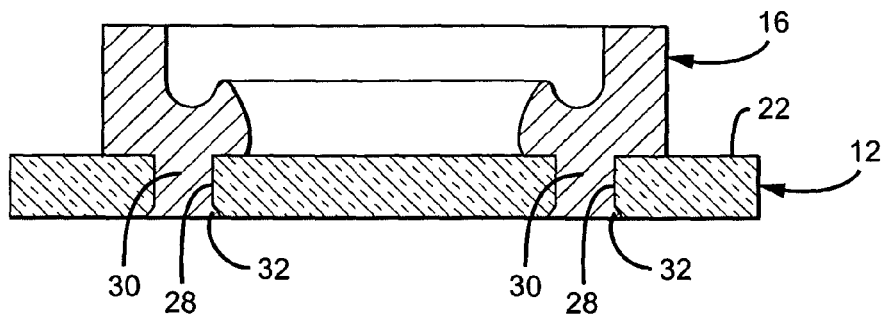
FIG. 11 is a sectional view of one embodiment of a semiconductor die package according to the present invention at a manufacturing step with an injection molded reflector cup.

The present invention provides improved semiconductor die package performance through adhesive-free assembly of the substrate and reflector cup components of the package. In one embodiment, the reflector cup is injection molded onto a surface of the substrate and is held in place by adhesive free anchors. In another embodiment, the reflector cup is molded separate from the substrate and is secured in place on the substrate through various processes including deformation of a portion of the reflector cup such that the reflector cup is again held in place by adhesive free anchors. Portions of the reflector cup may be made reflective either by molding it from light reflective/scattering material or through the addition of a reflective element, such as a piece of foil material that is secured to the reflector preferably without the use of an adhesive. A variety of interchangeable reflective elements having different surface shapes, and thus different light reflecting properties, may be used.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a reflector cup, layer, region, traces or substrate is referred to as being "on" another element, it can be directly on the other element or intervening elements may also be present. It will be understood that if part of an element, such as a surface, is referred to as "inner", it is farther from the outside of the device than other parts of the element. Furthermore, relative terms such as "beneath", "below", "top" or "bottom" may be used herein to describe a relationship of one element, layer or region to another element, layer or region. It will be understood that these terms are intended to encompass different orientations of the device in addition to the orientation depicted in the figures. Finally, the term "directly" means that there are no intervening elements.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section without departing from the teachings of the present invention.

Referring now to the drawings and particularly to FIGS. 1 and 2, there is shown one embodiment of a semiconductor device die package 10 according to the invention. The die package 10 includes a substrate 12, a semiconductor light emitting device assembly 14 mounted on the substrate and a reflector cup assembly ("reflector cup") 16 also mounted on the substrate 12. FIGS. 3 and 4 show the substrate 12 and reflector cup 16, respectively.

As used herein, the term semiconductor light emitting device may include a light emitting diode (LED), laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. The design and fabrication of semiconductor light emitting devices is well known to those having skill in the art and need not be described in detail herein. For example, the semiconductor light emitting device may be gallium nitride-based LEDs or lasers fabricated on a silicon carbide substrate such as those devices manufactured and sold by Cree, Inc. of Durham, N.C. although other emitting devices from other material systems may also be used. The light emitting device assembly 14 shown in FIGS. 1 and 2 (and the figures that follow) preferably comprises an LED 17 mounted to a submount 18. The LED/submount assembly is then mounted to the substrate 12 and electrical connection is made to the LED using methods known in the art. The LED 17 and submount 18 are generally referred to herein as LED 17.

The substrate 12 may be formed of many different materials with a preferred material being electrically insulating. Suitable substrate materials include, but are not limited to, ceramic materials such as aluminum-oxide or aluminum-nitride. The reflector cup 16 should be formed of durable, high melting temperature material that can withstand subsequent packaging manufacturing steps and the heat generated by the package during operation. Many different materials can be used, such as high melting temperature materials including plastics, such as a Novella resin, or liquid crystal polymers, such as those available from Quantum Leap Packaging, Inc. As used herein "high temperature material" means a material able to withstand 150-200° C., at a minimum. As further described below, the reflector cup 16 can be made of a material that reflects/scatters light from the LED 17.

As discussed in more detail below, the reflector cup 16 is arranged to reflect light generated by the LED 17 upwardly and away from the die package 10 so that it can contribute to useful light emission of the package 10. The reflector cup 16 can have many different shapes and sizes and to enhance its reflectivity, may include a reflective element 20 covering different portions of the reflective cup area around the LED 17, such as surface surrounding the LED 17. Alternatively, the reflector cup 16 can be made of a reflective material such that light from the LED directed toward the surfaces of the reflective cup is reflected to contribute to die package emission.

Packages 10 according to the present invention are arranged so that the reflector cup 16 and substrate 12 cooperate to anchor the reflector cup 16 to the substrate 12 without the use of adhesives. A preferred die package according to the present invention uses no adhesives for mounting the reflector cup 16, but in other embodiments adhesives can be used in conjunction with the reflective cup and anchor arrangement.

Referring now to FIGS. 2 and 3, the substrate 12 has a top surface 22 and a bottom surface 24, with the top surface 22 comprising electrical traces 25 and a mounting pad 26, with LED 17 mounted to the mounting pad 26 and the electrical traces providing an conductive path for electrical connection to the LED 17. The mounting pad 26 covers a portion of the top surface (including portions of the traces 25) and is typically located near the center of the top surface 22. The traces 25 provide electrical connection to the LED 17 either through the submount 18 or by a bond wire between one of the traces 25 and the LED 17.

Referring now to FIGS. 2-4, one embodiment of an anchor arrangement according to the present invention is shown. The substrate 12 comprises a number of thru-holes 28 running between its top and bottom surfaces 22, 24. In other embodiments, all or some of the holes 28 can pass partially through the substrate 12 as further described below. In a preferred embodiment, the substrate 12 includes four thru-holes 28, although fewer or more thru-holes can also be used. The thru-holes 28 and traces 25 are arranged such that the holes 28 do not interfere with the electrical path provided by the traces 25. The reflector cup 16 comprises four mounting posts 30 arranged and sized to mate with the thru-holes 28 in the substrate 12. As described in further detail below, the reflector cup 16 can be injection molded onto the substrate 12 with the reflector cup material filling the substrate thru-holes 28 and forming the posts 30. Alternatively, the reflector cup 16 can be separately formed with posts 30 and then placed on the substrate 12, with the posts 30 inserted into the thru-holes 28. The posts 30 can then be heated, deformed or otherwise manipulated so that the reflector cup 16 is anchored in place on the substrate 12 by the posts 30 and positioned substantially flush with the top surface 22 of the substrate 12.

FIGS. 5-10 show different embodiments of the reflector cup 16 and substrate 12 combinations, with the reflector cup mounted by the cooperation of its posts 30 with the substrate thru-holes 28. In these embodiments, the thru-holes 28 run through the substrate 12 form the top surface 22 to bottom surface 24. In the configuration shown in FIG. 5, the bottom surface 24 of the substrate 12 around thru-holes 28 is shaped to provide a larger diameter surface that helps secure the posts 30 in the thru-holes 28. The larger diameter surface can have different shapes, and in one embodiment, it is shaped to provide a tapered portion 32 surrounding the thru-holes 28. In another embodiment, it is shaped to provide an oversized ring 34 around the thru-hole 28. When the reflector cup 16 is mounted to the substrate 12, such as by injection molding, the posts 30 fill the thru-holes 28 so that reflector cup 16 is at least partially secured to the substrate 12 by larger diameter portions of the posts that extend over the tapered portions 32 or the ring 34. As shown, the posts 30 fill the holes 28, but it is understood that the posts 30 could fill less than all of the holes 28 as long as the posts 30 and thru-holes 28 cooperate to anchor the reflector cup 16 to the substrate 12.

FIG. 6 shows another embodiment of a die package according to the present invention wherein the thu-holes 28 do not have a larger diameter surface and the bottom surface 24 of the substrate 12 is flat in the area of the thru-holes 28. The reflector cup 16 is secured to the substrate by deformed portions 36 of the reflector cup posts 30 that extend beyond the bottom surface 24 with the deformed potions 36 having diameters greater than the diameter of the thru-holes 28.

With continued reference to FIGS. 5 and 6, the reflector cup 16 has an inner wall 38 and an outer wall 40 separated by a moat 42, with a reflective element 20 located on the inner wall 38. As shown in FIG. 5, the reflective element 20 comprises a reflective material, such as silver foil, in the form of a ring that can be press fit to conform to the inner wall 38 surrounding the LED 17. Accordingly, the reflective element 20 can be mounted in place without the use of adhesives. In another configuration as shown in FIG. 6, the reflective element 20 is a foil ring that snap fits to the reflector cup 16. In this configuration, the inner wall 38 of the reflector cup 16 is formed to include a snap-fit structure 46 that interacts with a snap-fit structure 48 on the reflective element 20.

The reflective elements 20 illustrated in FIGS. 5 and 6 are of substantially uniform thickness and provide a reflective surface having a surface shape substantially the same as the inner wall 38 of the reflector cup 16. In other embodiments according to the present invention, the reflective element may have varying thickness characteristics that produce a surface shape different from the inner wall 38. For example, FIG. 7 shows another embodiment of a die package according to the present invention having a reflector cup 16 anchored to a substrate 12, wherein the reflective element 20 may have a thickened portion 52 at the top, and a substantially straight inner wall 54 that transitions to a curved lower portion 56 having a gradually decreasing thickness. FIG. 8 shows still another embodiment of a die package with a reflector cup 16 anchored to a substrate 12, wherein the reflective element 20 may have a thickness that gradually decreases from the top 57 to a certain point at the bottom where it then begins to increase to form a concave lower portion 58. These different shaped surfaces reflect light from the LED differently and thus provide different light output characteristics, e.g., a more focused light or more scattered light.

The reflective elements 20 illustrated in the figures are a few examples of different surface shapes that may be imparted to the reflective surface 50 of the reflector cup 16. A great variety of different shaped reflective elements 20, each compatible with the reflector cup 16, may be designed depending on the desired light beam output pattern. Thus by using different shaped reflective elements with a standard reflective cup, a variety of LED packages having different light output characteristics may be fabricated without having to modify the shape of the reflector cup 16.

The reflector cup 16 can be anchored to the substrate 12 using many different cooperating elements beyond those shown above in FIGS. 5-8. As shown in FIGS. 9 and 10, the substrate 12 can have holes 60 that do not pass completely though, but instead pass only partially from the top surface 22 to the bottom surface 24, through the substrate 12. In FIG. 9, the base of the holes 60 can have a tapered portion 62 such that when the posts 64 fill the holes 60, the taped portion 62 is filled by the post material to anchor the reflector cup 16 to the substrate 12. The holes 60 and tapered portion 62 can be formed in many different ways such as by etching or drilling. Alternatively, the substrate 12 can be formed of upper and lower portions 65, 66, with the holes 60 and tapered portions 62 formed in the upper portion 65 and the upper and lower portions 65, 66 bonded together. FIG. 10 shows another embodiment of the substrate holes 67 that pass partially though the substrate 12 and do not have a tapered portion. Posts 69 are arranged to mate with the holes 67 to anchor the reflector cup 16. In the embodiments of FIGS. 9 and 10, the reflector cup 16 can be injection molded onto the substrate 12 or it can be separately formed and then mounted to the substrate. It is also understood that different types of reflector cup and die components can cooperate to anchor the reflector cup such as hooks, snaps, clamps, etc., with each of these anchoring the reflector cup without the use of an adhesive.

The die package 10 described above can be manufactured using many different methods having steps that can be performed in different sequences. With reference to FIG. 11, a die package configured in accordance with the invention may be manufactured by first providing a substrate 12 with thru-holes and anchoring a reflector cup 16 to the substrate 12. As discussed above, in one embodiment, this may be done by injection molding reflector cup material such that the material passes into and through the thru-holes 28, to form the posts 30. The material is also injected directly onto the top surface 22 of the substrate 12 to form the reflector cup 16 anchored to the substrate 12. During the injection molding process, the base material adheres to the top surface and to the walls of the thru-holes to at least partially secure the reflector cup 16 in place. The portions of the posts 30 that extend over the tapered portions 32 also secure the reflector cup 16 to the substrate 12.

Figure 12:
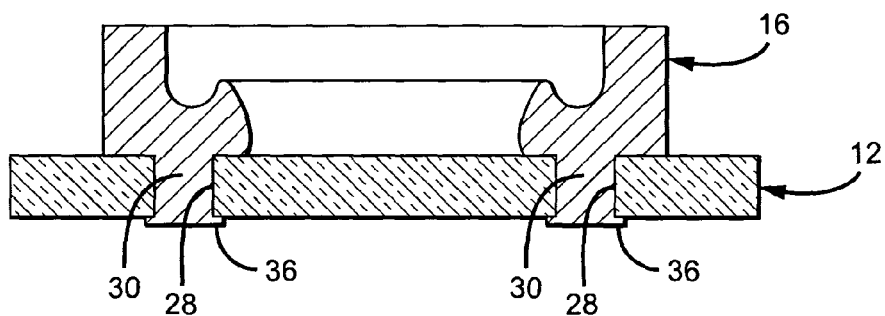
FIG. 12 is a sectional view of another embodiment of a semiconductor die package according the present invention at a manufacturing step with a reflector cup secured through post deformation.

In an alternate embodiment shown in FIG. 12, a reflector 16 having thru-hole posts 30 may be molded separate from the substrate 12, such as by injection molding, and then secured to the substrate 12 during a separate manufacturing step. For example, the reflector cup 16 may be placed on the substrate by positioning the posts 30 through the substrate thru-holes 28 and secured in place by deforming the portions 36 of the posts 30 that extend beyond the bottom surface 24 of the substrate to secure the reflector base in place. The extending portion of the posts may be deformed, for example by melting them with a hot knife. During formation of the reflector cup 16, either by injection molding or separate formation, the reflector cup 16 can include many features to assist in encapsulation and/or attachment of secondary optics such as a meniscus defining rim or snap-fit aligning tabs.

Figure 13:
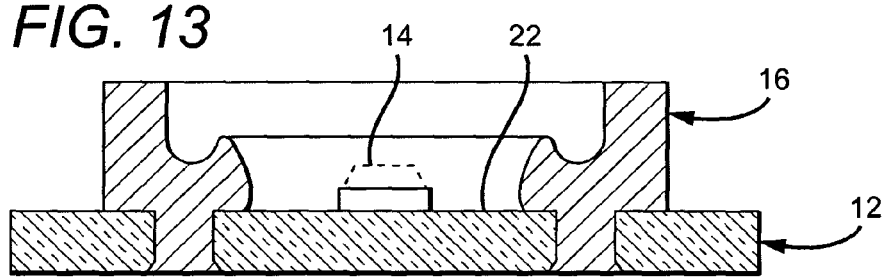
FIG. 13 is a sectional view of the partial package of FIG. 11 with a LED assembly mounted on the substrate.
Figure 14:
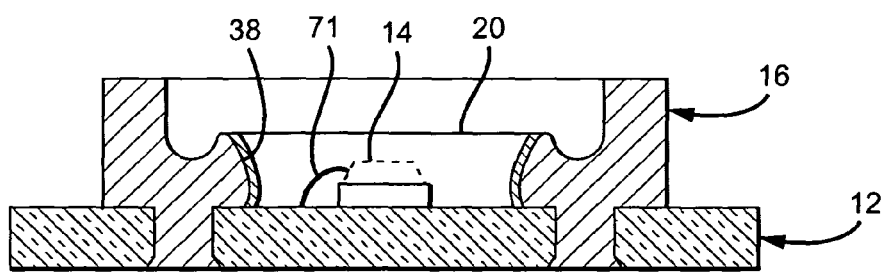
FIG. 14 is a cross-section of the partial package of FIG. 11 with a reflective element press-fit to an inner wall of the reflector cup.

As shown in FIG. 13, once the substrate 12 and reflector cup 16 are assembled, the LED assembly 14 is mounted on the top surface 22 of the substrate (preferably on a mounting pad 26 as shown in FIG. 3) using known stack and reflow processes. Next, as shown in FIG. 14, the assembly can be cleaned and a reflective element 20 can be placed on the inner wall 38 of the reflector cup 16. In one manufacturing process according to the present invention, the reflective element 20 can be press-fit on the inner surface using a pick-up collet process to shape and secure the reflective element 20 in place.

In other processes, the reflective element 20 may be placed on the inner wall 38 prior to mounting the LED assembly 14. For example, in the injection-molded on the substrate embodiment, from a manufacturing perspective, it may be advantageous to have the reflective element 20 press fitted or snap fitted to the reflector cup 16 immediately after the injection molding process. In the separate-molded configuration, the reflector element 20 may be placed on the reflector base either prior to or after securing the reflector base to the substrate 12.

With continued reference to FIG. 14, after assembly of the reflector cup 16 and reflective element 20, the substrate and mounting the LED assembly 14, the LED assembly can be wire bonded 71 to the substrate, preferably to a wire trace 25 as shown in FIG. 3. The LED assembly 14 can then be encapsulated in the substrate/reflector assembly using encapsulation material such as, for example, silicones or polymers. The encapsulation material is preferably high temperature polymer with high light transmissivity and a refractive index that matches or closely matches the refractive index of the lens 18, which may be made from glass, quartz, high temperature and transparent plastic, silicone or a combination of these materials. After encapsulation, a lens can be placed on top of and adheres to the encapsulation material as described below.

FIG. 15 shows another embodiment of a die package 80 according to the present invention, comprising a substrate 12 and LED 14. A reflector cup 82 is included that is made from a plastic that has light reflecting/scattering properties. As discussed above an example of one such plastic is Amodel™, which is available from Solvay Advanced Polymers, LLC., (www.solvayadvancedpolymers.com). In this configuration, a separate reflective element is not needed due to the reflective properties of the reflector cup 82 material. Thus, the reflector cup 82 by itself has reflective properties sufficient to reflect the LED light. Just as with the reflector cups discussed above, reflector cup 82 has posts 84 that cooperate with the substrate thru-holes 86 to mount the reflector cup 82 to the substrate 12. The thru-holes 86 can be fully or partially through the substrate 12 and the corresponding post is sized to fit its corresponding thru-hole.

The embodiment of FIG. 15 may be manufactured using either of the injection-molded or the separate-molded processes previously described. However, because the reflector cup material may have a low tolerance to high temperatures, other processing steps may have to be altered. For example, during the stack die and reflow process, a high-temperature tolerant silver-tin solder paste may need to be used to secure the LED assembly 14 to the top surface 22 of the substrate 12 instead of a gold-tin solder paste. In this configuration, different light output characteristics for the LED package 80 may be obtained by changing the surface shape of the inner surfaces of the reflector cup 82. Alternatively, the reflector cup can be used with different reflective elements as described above to obtain different light output characteristics.

Referring now to FIGS. 16 and 17 and as mentioned above, after the LED assembly 14 and reflector cup 16 are mounted to the substrate 12, an encapsulating material, such as liquid silicone gel, can be injected into the cavity 90 of the reflector cup, filling the cavity 90 and covering the LED assembly 14, the substrate's exposed surfaces within the cavity 90, and surfaces of the reflector cup 16 in the cavity, depending on how much encapsulating material is used. As shown in FIGS. 16 and 17, after injection of the encapsulating material (not shown), secondary optics, such as a lens 92 can be placed over the cavity 90 of the reflector cup 16 and in contact with the encapsulating material. The die package 10 is typically heat-cured, which causes the encapsulating material to solidify and adhere to the lens 92, holding lens 92 in place over the reflector cup cavity 90. Many different lenses and encapsulating materials can be used in die packages according to the present invention to provide different output characteristics.

It will be apparent from the foregoing that while particular forms of the invention have been illustrated and described, various modifications can be made without departing from the spirit and scope of the invention. Accordingly, it is not intended that the invention be limited, except as by the appended claims.

We claim:

1. A semiconductor device die package comprising:
    a substrate having a first surface for supporting a semiconductor device, a second surface opposite said first surface, and one or more substrate holes in said substrate at said first surface, wherein said substrate at least partially comprises one or more ceramic materials, and
    a reflector cup on said substrate surrounding one or more light emitting devices, said reflector cup comprising a singular aperture exposing and surrounding all of said one or more light emitting devices, said reflector cup further comprising a plurality of moldable posts, each of which cooperates with a respective one of said substrate holes to anchor said reflector cup to said substrate, said posts not extending beyond said second surface, wherein said reflector cup comprises a high temperature resistant material, said reflector cup further comprising an inner wall and an outer wall separated by a moat, said inner wall and an inner surface of said outer wall both facing in a direction toward said one or more light emitting devices, and at least a portion of said inner wall is reflective and is in a form of a ring.

2. The package of claim 1, wherein said substrate holes pass at least partially through said substrate.

3. The package of claim 2, wherein each of said posts is inserted into a respective one of said substrate holes to anchor said reflector cup to said substrate.

4. The package of claim 1, wherein said one or more substrate holes pass through said substrate between said first and second surfaces.

5. The package of claim 4, wherein each of said posts passes through its respective one of said substrate holes and extends to the second surface to secure said reflector cup to said substrate.

6. The package of claim 1, wherein the substrate is formed of an electrically insulating material.

7. The package of claim 1, wherein the material comprises a plastic.

8. The package of claim 7, wherein the material is a Novolac resin.

9. The package of claim 1, wherein said reflector cup is formed of a reflective material.

10. The package of claim 9, wherein said material comprises a liquid crystal polymer.

11. The package of claim 1, wherein the reflector cup is formed of light scattering moldable plastic.

12. The package of claim 1, wherein said reflector cup further comprises a reflective element.

13. The package of claim 12, wherein the reflective element comprises a foil material.

14. The package of claim 13, wherein the foil material has a substantially uniform thickness and conforms to a surface of said reflector cup to provide an inner surface having a surface shape substantially the same as the surface of said reflector cup.

15. The package of claim 13, wherein the foil material has a varying thickness and one side that conforms to a surface of said reflector cup to provide an inner surface having a surface shape different than the surface of said reflector cup.

16. The package of claim 12, wherein the reflective element comprises a snap-fit structure and reflector cup comprises a snap-fit structure configured to engage the snap-fit structure of the reflective element.

17. The package of claim 1, wherein said posts extend through said substrate such that said posts are flush with said second surface.

18. The package of claim 1, wherein said substrate comprises a thermally conductive material.

19. A light emitting diode (LED) die package comprising:
a substrate having a first surface with a mounting pad and one or more first mounting devices, wherein said first mounting devices comprise a plurality of holes in said substrate at said first surface, said holes surrounded by said substrate, wherein said substrate at least partially comprises one or more ceramic materials;
one or more LEDs mounted on said mounting pad;
a reflector cup having a singular cavity exposing and surrounding all of said one or more LEDs, said reflector cup further comprising one or more second mounting devices, said reflector cup anchored to said substrate by said first mounting devices cooperating with said second mounting devices, and wherein said reflector cup comprises a high temperature resistant material, said reflector cup further comprising an inner wall and an outer wall separated by a moat, said inner wall and an inner surface of said outer wall both facing the center of said cavity; and
a reflective element associated with said reflector cup to reflect light from said LED, wherein a portion of said reflective element associated with at least a portion of said inner wall is capable of reflecting light from said LED and is in a form of a ring.

20. The package of claim 19, wherein said reflector cup has an inner surface substantially surrounding said LED, said reflective element associated with said inner surface.

21. The package of claim 19, wherein said second mounting devices comprise one or more posts, each of which cooperates with a respective one of said holes to anchor said reflector cup to said substrate.

22. A light emitting diode (LED) die package comprising:
a substrate having first and second surfaces and a mounting pad on the first surface;
an LED assembly comprising one or more LEDs mounted on said mounting pad;
a base secured to the first surface, the base having an inner surface substantially surrounding said LEDs and the mounting pad; and
a reflective element associated with the inner surface, said reflective element comprising a singular cavity exposing and surrounding said LED assembly, wherein the reflective element further comprises a snap-fit structure with said inner surface, and wherein said reflective element comprises a high temperature resistant material, said reflective element further comprising said inner surface and a second inner surface separated by a moat, said inner surface and said second inner surface both facing the center of said cavity, wherein at least a portion of said inner surface is reflective.

23. The package of claim 22, wherein the reflective element has a substantially uniform thickness and conforms to the inner surface to provide a reflective inner surface having a surface shape substantially the same as the inner surface of the base.

24. The package of claim 22, wherein the reflective element has a varying thickness and one side that conforms to the inner surface to provide a reflective inner surface having a surface shape different than the inner surface of the base.

25. The package of claim 22, wherein the reflective element is press fit to the inner surface.

26. The package of claim 22, wherein the base comprises a snap-fit structure configured to engage the snap-fit structure of the reflective element.

27. A semiconductor device die package comprising:
a substrate having a first surface for supporting a semiconductor device, and one or more substrate holes in said substrate at said first surface, said holes surrounded by said substrate, wherein said substrate at least partially comprises one or more ceramic materials, and
a single reflector cup on said substrate surrounding one or more light emitting devices, said single reflector cup comprising a singular aperture exposing and surrounding all of said one or more light emitting devices, said reflector cup further comprising a plurality of moldable posts, each of which cooperates with a respective one of said substrate holes to anchor said single reflector cup to said substrate, and wherein said reflector cup comprises a high temperature resistant material, said single reflector cup further comprising an inner wall and an outer wall separated by a moat, said inner wall and an inner surface of said outer wall both facing toward said one or more light emitting devices, and at least a portion of said inner wall is reflective.

28. A semiconductor device die package comprising:

a substrate having a first surface for supporting a semiconductor device, wherein said substrate at least partially comprises one or more ceramic materials, and a single reflector cup injection molded on said substrate, said reflector cup surrounding one or more light emitting devices and comprising a singular aperture exposing and surrounding all of said one or more light emitting devices, said single reflector cup further comprising an inner wall and an outer wall separated by a moat, said inner wall and an inner surface of said outer wall both facing toward said one or more light emitting devices, and at least a portion of said inner wall comprises a snap-fit structure which interacts with another snap-fit structure on a reflective element that is in a form of a ring.

29. A semiconductor device die package comprising:

a ceramic substrate having a first surface for supporting a semiconductor device, and one or more substrate holes in said substrate at said first surface; and a single reflector cup mountable on said substrate and provided to surround one or more light emitting devices, said single reflector cup mountable on said substrate via a plurality of moldable posts, each of said moldable posts cooperating with a respective one of said substrate holes to anchor said single reflector cup to said substrate, said single reflector cup further comprising an inner wall and an outer wall separated by a moat, said inner wall and an inner surface of said outer wall both facing toward said one or more light emitting devices, and at least a portion of said inner wall is reflective and is in a form of a ring.

* * * * *